(12) United States Patent
Sambandan et al.

(10) Patent No.: US 7,867,916 B2
(45) Date of Patent: Jan. 11, 2011

(54) HORIZONTAL COFFEE-STAIN METHOD USING CONTROL STRUCTURE TO PATTERN SELF-ORGANIZED LINE STRUCTURES

(75) Inventors: Sanjiv Sambandan, Palo Alto, CA (US); Robert A. Street, Palo Alto, CA (US); Ana Claudia Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/485,007

(22) Filed: Jun. 15, 2009

(65) Prior Publication Data
US 2010/0317160 A1 Dec. 16, 2010

(51) Int. Cl.
H01L 51/40 (2006.01)
H01L 21/84 (2006.01)
H01L 21/461 (2006.01)
H01L 21/469 (2006.01)

(52) U.S. Cl. .......... 438/765; 438/99; 438/149; 438/750; 438/758; 438/779; 257/E21.015; 257/E21.017; 257/E21.018; 257/E21.021; 257/E21.269

(58) Field of Classification Search .......... 257/E21.015, 257/E21.017, E21.018, E21.021, E21.269
See application file for complete search history.

(56) References Cited

U.S. PATENT DOCUMENTS

| 7,331,218 | B2 | 2/2008 | Trainoff |
| 7,776,709 | B2* | 8/2010 | Colburn et al. .............. 438/401 |
| 2009/0047423 | A1* | 2/2009 | Robinson .................... 427/123 |

OTHER PUBLICATIONS

Deegan et al.: "Contact Line Deposits in an Evaporating Drop", Physical Review E, vol. 62, No. 1, Jul. 2000, pp. 756-765.

* cited by examiner

*Primary Examiner*—Charles D Garber
*Assistant Examiner*—Mohsen Ahmadi
(74) *Attorney, Agent, or Firm*—Bever, Hoffman & Harms, LLP; Patrick T. Bever (57) ABSTRACT

A modified coffee-stain method for producing self-organized line structures and other very fine features that involves disposing a solution puddle on a target substrate, and then controlling the peripheral boundary shape of the puddle using a control structure that contacts the puddle's upper surface. The solution is made up of a fine particle solute dispersed in a liquid solvent wets and becomes pinned to both the target substrate and the control structure. The solvent is then caused to evaporate at a predetermined rate such that a portion of the solute forms a self-organized "coffee-stain" line structure on the target substrate surface that is contacted by the peripheral puddle boundary. The target structure is optionally periodically raised to generate parallel lines that are subsequently processed to form, e.g., TFTs for large-area electronic devices.

10 Claims, 9 Drawing Sheets

HORIZONTAL COFFEE-STAIN METHOD USING CONTROL STRUCTURE TO PATTERN SELF-ORGANIZED LINE STRUCTURES

FIELD OF THE INVENTION

This invention relates to large-area electronics and other technologies requiring very fine line structures, and more particularly to methods for producing such closely-spaced, very fine line structures.

BACKGROUND OF THE INVENTION

Large-area electronic devices, such as flat panel displays, sensor arrays, and space antennas, typically include large-area sensor or light-emitting electronic cells that are addressed and/or controlled by thin film transistors (TFTs) and other electrical and electronic devices (e.g., passives and photodiodes). Such large-area electronic devices are expensive to make by conventional photolithography techniques due to the relatively large size of the electronic cell arrays (e.g., 1000 $cm^2$ or larger), and the relatively large spacing between adjacent TFTs. Conventional photolithography equipment for fabricating typical (i.e., approximately 300 $cm^2$ or smaller) IC devices is typically constructed to receive and process a semiconductor wafer having a predetermined size, and such wafers are typically much smaller than the substrate of a large-area electronic device. Therefore, specialized equipment for photolithography on large-area substrates must be developed typically at great expense. Moreover, conventional photolithography equipment includes optical and other processing tools that are constructed to facilitate the formation of substantially smaller feature sizes than those required in many elements of large-area electronic devices, thereby making the production of large-area electronic devices using such photolithography equipment highly inefficient.

Polymer semiconductor based field effect transistors are of particular interest for large-area electric device applications such as printed electronics on flexible substrates. However, the typical semiconductors used to make conventional polymer semiconductor based field effect transistors have low mobility (typically 0.001 $cm^2/Vs$ to 1 $cm^2/Vs$). Therefore, the poor transconductance of these devices is a bottleneck for any application. One possible means to improve the transconductance is to improve the aspect ratio (channel width to channel length) of the transistor. However, improving the aspect ratio comes at the cost of layout area and feature size. Therefore, there appears a need for fine feature patterning of electrodes. While lithography can achieve fine features, it eliminates the possibility of low cost, roll to roll electronics which is the advantage of polymer electronics.

Jet-printing, offset printing and other printing techniques represent emerging technologies that attempt to reduce the costs associated with IC production for large-area electronic devices by replacing expensive photolithographic processing with simple printing operations, for example, in which layer structures are formed using nanoparticles and other materials in a solution that is ejected from a print head. By printing an IC pattern directly on a device substrate rather than using the delicate and time-consuming lithography processes used in conventional IC manufacturing, a jet-printing system can significantly reduce IC production costs. The printed IC pattern can either comprise actual IC features (i.e., elements that will be incorporated into the final IC, such as the gates and source and drain regions of TFTs, signal lines, the semiconductor, opto-electronic components, etc.), or it can be a mask printed onto the substrate that is used for subsequent semiconductor processing steps (e.g., etch, implant, etc.).

A problem with conventional jet-printing and other printing techniques is that the feature size (e.g., the width of each printed line) of printed structures is larger than desired in some large-area electronic devices, such as polymer semiconductor based field effect transistors. That is, the feature size of the pattern is limited by the printing technique, and is often much larger than is desired, particularly in the formation of TFTs. A reduction in feature size may be achieved by improving the printing system to pattern finer (smaller) features (e.g., using a smaller nozzle size for a jet-printer). However, most techniques are limited to a feature size of 30 microns or larger, which is often much larger than is desired, particularly in for the TFTs of a large-area electronic device.

Recent studies of the so-called coffee-stain effect have yielded speculation that the concentric lines formed by evaporating drops on horizontal surfaces may prove useful in the production of electronic devices. The phrase "coffee-stain effect" refers to the phenomenon in which solids dispersed in a drying drop will migrate to the edge of the drop and form solid rings. In theory, if the solid dispersed in the solution is conductive (e.g., silver nanoparticles), then the resulting solid "coffee-stain" rings may be used to produce electronic structures. However, due to the inconsistency of the curved or round shape of coffee-stain rings formed by conventional methods, conductive coffee-stain rings would have very limited practical application in the fabrication of electronic devices.

What is needed is a method for producing thin metal lines and other very fine features that may be utilized in the production of large-area electronic devices (e.g., polymer semiconductor based field effect transistors), avoids the problems (e.g., high-cost, low-resolution) associated with conventional techniques such as lithography and conventional printing techniques, and avoids the randomly-shaped "coffee-stain ring" structures produced using conventional receding puddle approaches.

SUMMARY OF THE INVENTION

The present invention is directed to a modified coffee-stain method for producing self-organized line structures and other very fine features in a way that avoids the low-resolution and high-cost problems associated with conventional techniques by utilizing a control structure to control the peripheral boundary shape of a liquid solution puddle disposed on a target substrate. The modified coffee-stain method generally involves disposing a target substrate or other target structure such that the target substrate defines a horizontal planar surface, forming a solution puddle on the horizontal planar surface, and then disposing the control structure above the target substrate at a distance closer than the height of the liquid solution puddle such that the control structure contacts the liquid solution puddle. The solution puddle made up of a fine particle solute dispersed in a liquid solvent that is hydrophilic with respect to the target and control structures, whereby the attraction between the solution and the control structure produces a capillary bridge that biases the puddle's peripheral boundary to take the shape of the control structure. By utilizing, for example, a control plate having a long straight edge, the puddle's peripheral boundary forms on the target substrate with substantially straight sides. The solvent is then caused to evaporate at a predetermined rate such that a portion of said solute forms a self-organized "coffee-stain" structure along the puddle's peripheral boundary, including substantially straight portions defined by the straight sides of the control plate. By inducing the "coffee-stain" effect under these conditions, the resulting self-organized line structure assumes a predicable, repeatable, substantially straight-line shape, thereby providing structures that are more usable than the randomly-shaped "coffee-stain ring" structures produced using conventional receding puddle approaches. Further, as set forth by the various exemplary embodiments, the present invention facilitates the formation of low cost self-organized straight-line structures that may be utilized, for example, to form thin metal lines (e.g., conductive lines having a width of one micron or less) and other very fine features during the production of large-area electronic devices, thereby avoiding the low-resolution and high-cost problems associated with conventional techniques such as lithography or printing.

According to an aspect of the invention, the target substrate, control structure, solvent and solute are selected such that the liquid solvent has a stronger attraction to both the target substrate surface and the control structure than to itself, whereby a resulting balance of forces involving the liquid-air, liquid-solid (target structure and control structure), and solid-air surface tensions, lead to the solution puddle being pinned both to the control structure (i.e., at a central region of its upper surface) and to the target substrate (i.e., along its peripheral boundary). This balance leads to the peripheral puddle boundary forming an exponentially downward curving waterline (interface line) at the target substrate surface. That is, due to the molecular attraction between the solvent and the target substrate, the solvent becomes pinned to the target substrate along the waterline in a way that forms an abrupt rise where the solvent evaporates at an increased rate. By utilizing a fine particle solute (e.g., silver having an average particle size of one micron or less, preferably in the nanoparticle size range), the solute deposits on the target substrate at the peripheral boundary in a manner similar to that observed at the puddle perimeter in conventional coffee-stain effect studies, but in this case the shape of the peripheral boundary is biased by the control structure into a more useful shape. In one embodiment, the target substrate is the oxide of monocrystalline silicon, the control structure is the oxide of monocrystalline silicon the solution consists of a silver nanoparticle ink diluted in de-ionized water, and the rate of evaporation is controlled by adjusting the temperature and atmospheric pressure of the area surrounding the assembly such that the silver nanoparticles form conductive lines on the substrate that have a nominal width of one micron.

According to an embodiment of the present invention, the modified coffee-stain method is repeated to self-organize nanoparticles into nonintersecting curves or parallel lines, depending on the shape of the control structure. If the control structure is a straight edge (planar surface), the straight lines formed are almost parallel. In accordance with one specific embodiment, the parallel lines are produced by periodically shifting the control structure upward out of the solution puddle, thereby controlling the width of the puddle, and hence the distance between adjacent lines that form at the puddle's peripheral boundary (perimeter). In another embodiment, the control structure is maintained in a stationary position relative to the puddle, and a regular array of fine lines is printed on the target substrate due to a slip-slick phenomenon caused as the surface of the puddle recedes relative to the target substrate. In both instances, the resulting parallel lines may be printed with widths as small as one micron and having a spacing of five microns or less, which cannot be achieved using conventional printing techniques.

According to another specific embodiment of the present invention, the parallel lines of conductive nanoparticles are used to produce, e.g., high transconductance transistors for large-area electronic devices. First, the parallel lines formed using the methods described above are sintered so that the deposits of silver nanoparticles define parallel conductive lines. The lines are then isolated by cutting straight the lines into segments using a laser or a comb of soft picks. In one specific embodiment, source and drain contacts are printed onto opposite ends of the lines, and then the contact terminations are cut using, for example, a laser to provide an inter-digitated TFT with high width to length ratio. In another specific embodiment, a grid TFT structure is formed with the lines lying within the channel and parallel to the source and drain electrodes. In yet another embodiment, an impurity (e.g., a gate metal) is intentionally introduced onto the target substrate that causes the subsequently formed lines to bend into a desired shape, thereby forming an intended TFT structure. In other embodiments, lines produced in accordance with the vertical coffee-stain method of the present invention are used to form fine capillaries and fluidic channels, electrical bus routes, and templates for small feature stamps without the use of photolithography. It must be noted however that the finely separated lines can be used as masks for a photolithographic process.

According to another aspect of the invention, line structures are simultaneously formed on a horizontal substrate and a vertically aligned substrate that serves as the control structure for the modified coffee-stain process, thereby improving processing time. Line structures are formed by the substantially straight waterline defined by the upper surface of the puddle against the side surface of the vertically aligned substrate, thereby providing reliably straight lines that are independent of contours or features disposed on the vertically aligned substrate. The simultaneously-formed parallel lines are then processed on the separate substrates in the manner set forth above.

According to another aspect of the invention, a shape of the parallel lines formed on the target substrate is controlled by a shape of the control structure contacting the solution puddle. For example, when the control structure includes a straight edge that is brought into contact with the upper surface of the solution puddle, the peripheral boundary of the puddle assumes a straight line shape that is parallel to the control structure edge, and the subsequently formed self-organized line structures are straight and parallel. In contrast, when the control structure includes a non-linear (e.g., curved or wavy) edge that is brought into contact with the upper surface of the solution puddle, the peripheral boundary of the puddle assumes a shape that is parallel to that of the control structure edge, and the subsequently formed self-organized line structures are parallel and similar to the non-linear shape of the edge. The present invention thus facilitates forming parallel lines having many shapes merely by changing the shape of the control structure utilized to contact the solution puddle.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved method for forming fine lines of material on target structures, and in particular to the formation of thin, closely spaced metal lines and other fine features on substrates during the production of large-area electronic devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
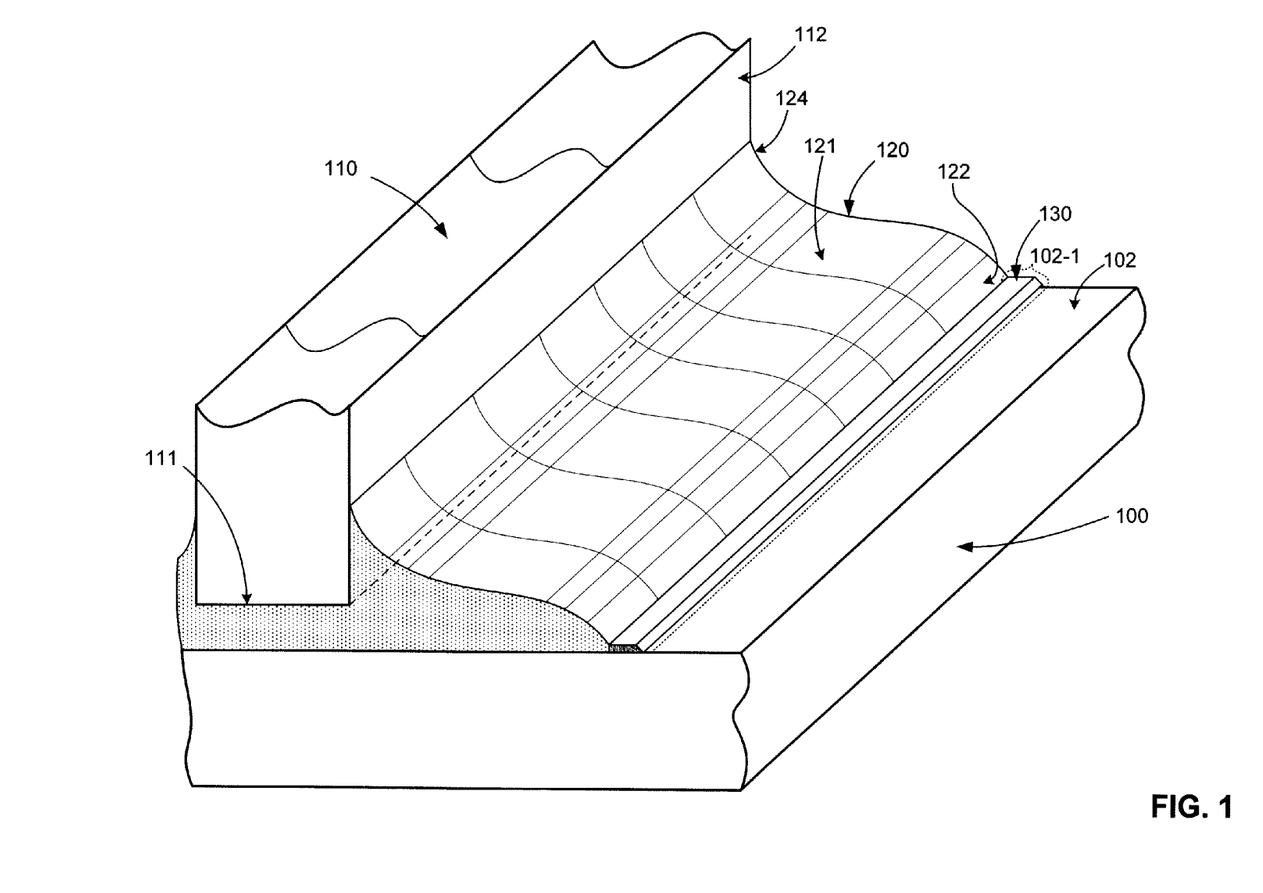
FIG. 1 is a top side partial perspective view showing the formation of a self-organized line according to an embodiment of the present invention.

FIG. 1 is a top side perspective, cutaway view showing an arrangement for performing a modified coffee-stain method used to producing self-organized line structures and other very fine features on a target substrate 100. In particular, FIG. 1 shows a portion of target substrate 100, a control structure 110 having a lower edge 111 and side surface 112 suspended above a horizontal, planar upper surface 102 of target substrate 100, and a quantity of a solution that is disposed in a puddle 120 on upper surface 102 of target substrate 100. As indicated, control structure 110 is in operable contact with an upper surface 121 of solution puddle 120 such that lower edge 111 is submerged within solution puddle 120.

According to an aspect of the present invention, target substrate 100, control structure 110 and solution 120 are matched such that solution 120 is pinned both to upper surface 102 of target substrate 100 and to lower surface 111 and side surface 112 of control structure 110. In particular, solution 110 includes a solute disposed in a liquid solvent, wherein the solvent is made up of liquid molecules having a stronger attraction to surfaces 102, 111 and 112 than to themselves (i.e., solution 120 is hydrophilic with respect to target substrate 100 and control structure 110). Under these conditions, the attraction of the liquid solvent to surface 102 causes solution 120 to form a downward curving peripheral boundary 122 that curves downward from puddle surface 121 to upper surface 102 of target substrate 100. In addition, the attraction of the liquid solvent to control structure 110 produces a waterline 124 on surface 112 similar to that shown in FIG. 1 (i.e., such that the point at which waterline 124 dies out on surface 112 is vertically higher than puddle surface 121 disposed away from control structure 110, and gradually curves downward from waterline 124 to puddle surface 121). In an exemplary specific embodiment, surface 102 comprises a hydrophilic material (e.g., oxygen plasma cleaned silicon oxide), and solution 110 comprises a solute disposed in de-ionized water (solvent). The attraction between the de-ionized water and surfaces 102, 111 and 112, particularly when the parameters discussed below are modified to favor attraction, produces the desired downward-curving peripheral boundary 122 and upward-curving waterline 124 shown in FIG. 1. The term "waterline" as used herein is intended to denote the linear region defined by the liquid/air/substrate interface formed by upper surface 115 of solution 110, surface 102 of target structure 100 and the gaseous atmosphere (e.g., air) disposed above upper surface 115. "Waterline" is not intended to be limited to liquid water unless otherwise specified.

According to another aspect of the present invention, the attraction between the solvent of solution puddle 120 and control structure 110 produces a capillary bridge that biases peripheral boundary 122 to take the shape define by surface 112 of control structure 110. In the example shown in FIG. 1, control structure 110 has a straight, planar edge 111 and a straight, planar surface 112 that cause the adjacent portion of peripheral boundary 122 to also form a substantially straight-line shape on target substrate 100. As described in additional detail below, the ability to control the shape of peripheral boundary 122 in this manner is not limited to straight-line shapes.

According to another aspect of the invention, the solute disposed in solution puddle 120 is made up of particles having an average size that is smaller than one micron ($10^{-6}$ m), and preferably is made up of nanoparticles (i.e., particles having an average size in the range of one to 100 nanometers ($10^{-9}$ m)). In a specific example used to produce conductive lines, solution 120 is formed by mixing a 40 uL of 20% silver (Ag) ink (produced by Cabot Corp. of Boston, Mass., USA) in 20 mL of DI Water. By utilizing silver nanoparticles, the solute were found to deposit on substrate 100 along peripheral boundary 122 in a manner similar to that observed in conventional coffee-stain effect studies when atmospheric conditions facilitated the evaporation of the solvent from solution puddle 120. However, inducing the "coffee-stain" effect with peripheral boundary 122 shaped by control structure 110, the resulting self-organized line structure 130 assumes a predicable, repeatable shape, (e.g., a substantially straight-line shape in the exemplary arrangement of FIG. 1), thereby providing line structures that are more usable than the randomly-shaped "coffee-stain ring" structures produced using conventional receding puddle approaches.

Figures 2, 3:
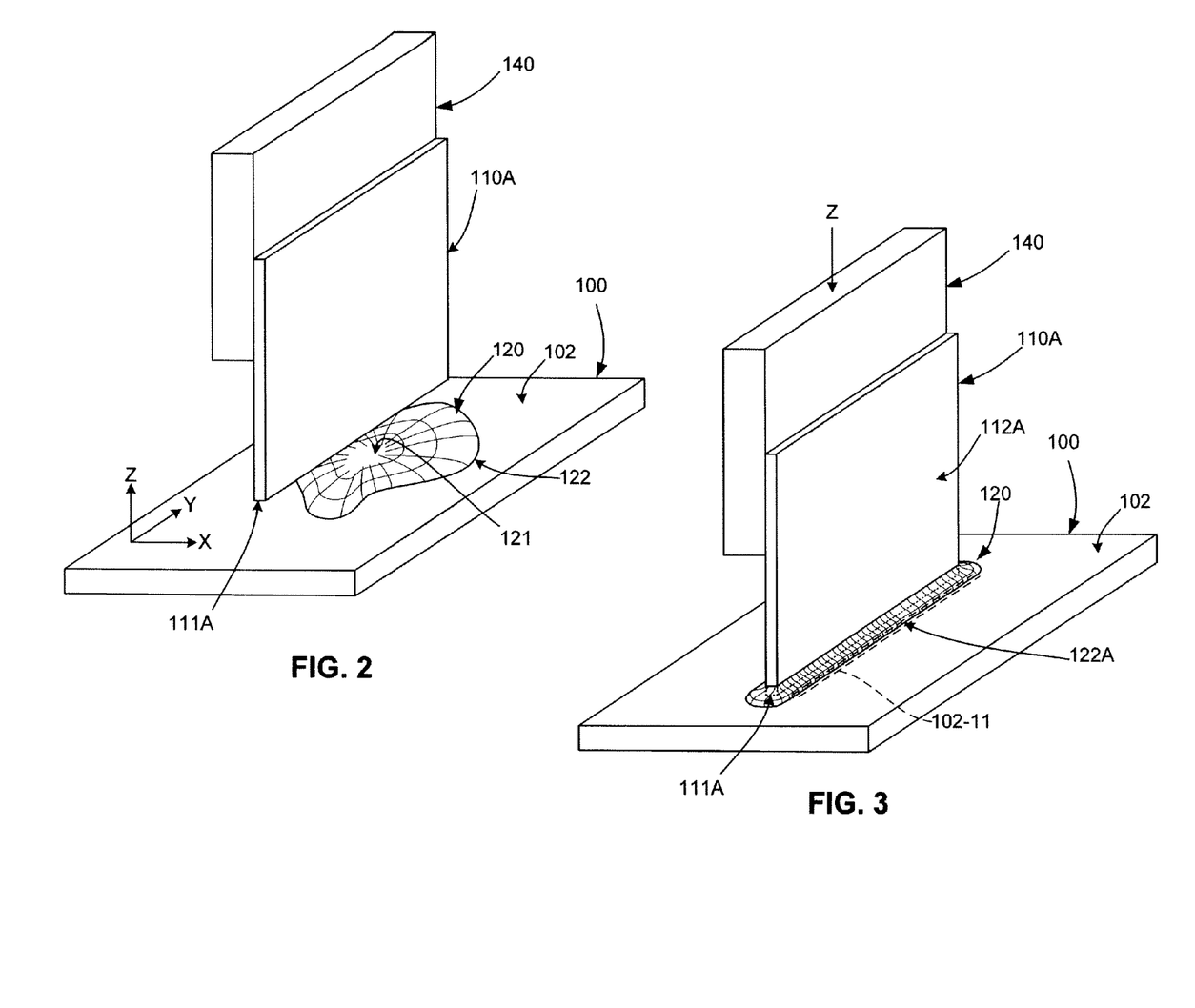
FIG. 2 is a top side partial perspective view showing an exemplary solution puddle arrangement for forming self-organized structures according to a specific embodiment of the present invention.
FIG. 3 is a top side partial perspective view showing the arrangement of FIG. 2 with the control structure in operable contact with the solution puddle.

FIGS. 2 and 3 are perspective views showing an arrangement for performing the modified coffee-stain method of the present invention to produce straight, self-organized line structures according to an exemplary embodiment of the present invention. A target substrate (bath plate) 100 is disposed in a horizontal position such that an upper its surface 102 is disposed in an X-Y plane that is horizontal to earth's gravitational force, which is directed along vertical line parallel to arrow Z. Solution puddle 120 is then formed on surface 102, which assumes an arbitrary peripheral boundary 122 that is pinned to surface 102 in the manner described above. A planar control substrate 110A is arranged perpendicular to target substrate 100 with its lower edge 111A parallel to upper surface 102, and is attached to a control structure 140 that is supported and controlled by a precision Z-axis positioning mechanism (e.g., a vernier calibrated optical mirror positioner, not shown. As indicated in FIG. 3, lower edge 111A of control substrate 110A is then lowered (or bath plate 130 is lifted) such that lower edge 111A of control substrate 100A is brought into contact with upper surface 121, whereby puddle 120 wets to control substrate 110A in a manner similar to that described above with reference to FIG. 1, and forms a capillary bridge between target substrate 100 and control substrate 110A. As described above and depicted in FIG. 3, puddle 120 is controlled by the now-formed capillary bridge such that peripheral boundary 122 assumes a straight alignment that is parallel to side surface 112A.

As set forth above, by dipping or otherwise submerging a straight-edged control structure in a nanoparticle solution puddle and causing the solvent to evaporate, a straight, self-organized line is patterned on a target substrate. According to another aspect of the invention that is described below, the modified coffee-stain method also facilitates forming closely-spaced, parallel self-organized lines on the target substrate by repeating the line forming process multiple times, for example, by moving the control structure at a constant or variable velocity in the Z-axis direction relative to the solution puddle, or by allowing the puddle to evaporate after establishing the arrangement depicted in FIG. 3.

Figure 4A:
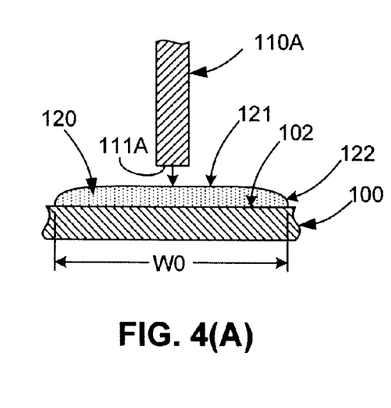
FIGS. 4(A), 4(B), 4(C), 4(D), 4(E) and 4(F) are partial cross-sectional side views showing the formation of self-organized line structures according to a specific embodiment of the present invention.
Figure 4B:
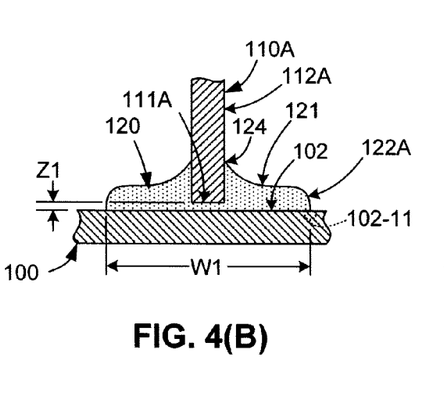
Figure 4C:
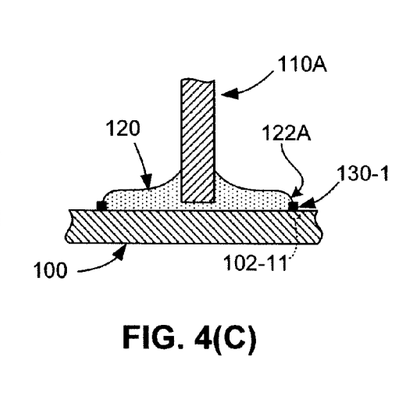
Figure 4D:
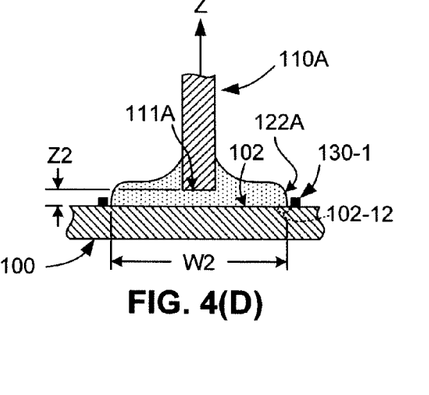
Figure 4E:
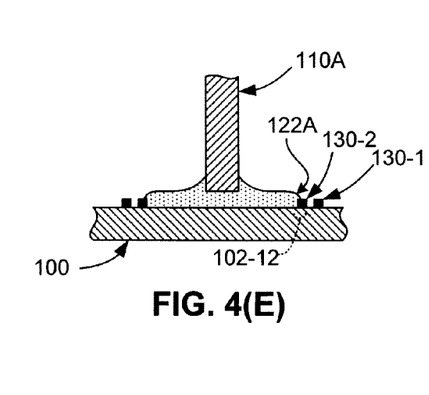
Figure 4F:
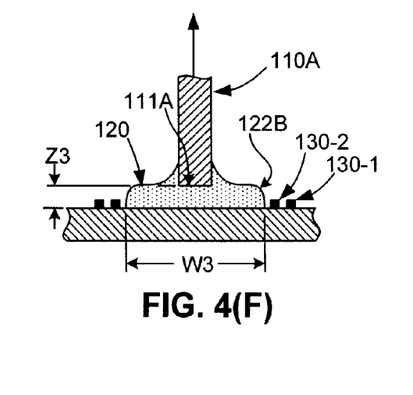

FIGS. 4(A) to 4(F) are partial edge views showing target substrate 100, control structure 110A, and puddle 120, and illustrate a process of slowly withdrawing substrate 100 from solution 120 in order to pattern lines in parallel on the surface of target substrate 100. Note that substrate 100, control substrate 110A and solution 120 are implemented using the arrangement described above with reference to FIGS. 2 and 3. FIG. 4(A) shows substrate 100, control substrate 110A and solution 120 before lower edge 111A of control substrate 110A is inserted into upper surface 121 of puddle 120, and indicates that peripheral boundary 122 has an arbitrary width W0. As indicated in 4(B), lower edge 111A of control substrate 110A is then inserted through upper surface 122 until lower edge 111A is a first distance Z1 from upper surface 102 of target substrate 100. Note that the attraction of solution puddle 120 to control substrate 110A generates a capillary bridge that lifts a portion of the solution (i.e., such that the surface tension between solution 120 and control substrate 110A generates the upward-curing waterline 124 in the manner described above). The formation of the capillary bridge causes the peripheral boundary 122A to shift inward and to align with the side wall 112A of control substrate 110A such that the width of puddle 120 changes to width W1, and peripheral boundary 122A is aligned over linear region 102-11. In the manner described above, substrate 100 is maintained in the fixed position shown in FIG. 4(B) until sufficient solvent evaporates from peripheral edge 122A of puddle 120 to form a (first) self-organized line 130-1 on substrate 100 along first linear surface region 102-11, as indicated in FIG. 4(C). As indicated in 4(D), control substrate 110A is then displaced (lifted) in the direction of arrow Z such that lower edge 111A of control substrate 110A is repositioned at a second distance Z2 from upper surface 102 of target substrate 100, which causes the capillary bridge to lifts a portion of the remaining solution, which in turn causes peripheral boundary 122A to shift inward again such that the width of puddle 120 changes to width W2, and peripheral boundary 122A is aligned over second linear region 102-12. Substrate 100 is again maintained in the fixed position shown in FIG. 4(C) until sufficient solvent evaporates from peripheral edge 122A of puddle 120 to form a (second) self-organized line 130-2 on substrate 100 along second linear surface region 102-12, as indicated in FIG. 4(E). As indicated in 4(F), control substrate 110A is then lifted again in the direction of arrow Z such that lower edge 111A of control substrate 110A is repositioned at a third distance Z3 from target substrate 100, which causes peripheral boundary 122A to shift inward again from second linear regions 102-12 to a width W3. This process is repeatable to generate multiple parallel lines.

Figure 5A:
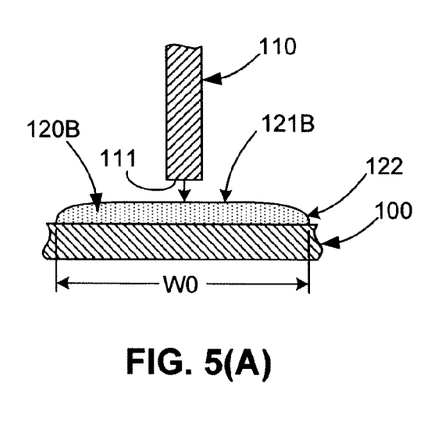
FIGS. 5(A), 5(B), 5(C), 5(D), 5(E) and 5(F) are partial cross-sectional side views showing the formation of self-organized line structures according to another specific embodiment of the present invention.
Figure 5B:
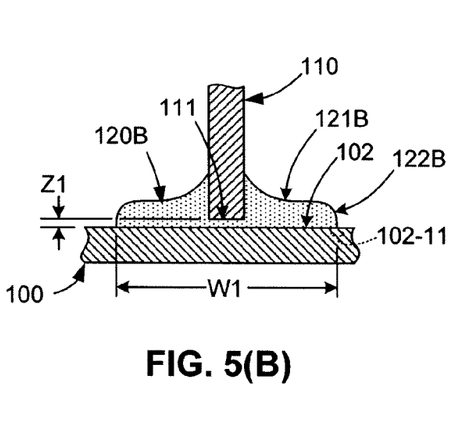
Figure 5C:
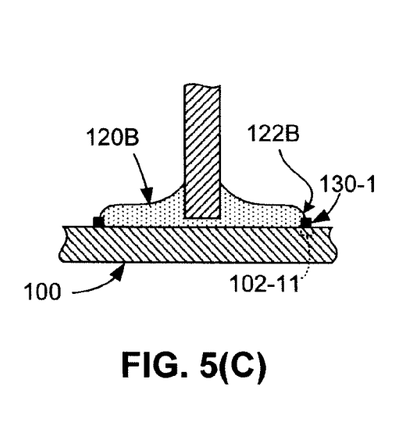
Figure 5D:
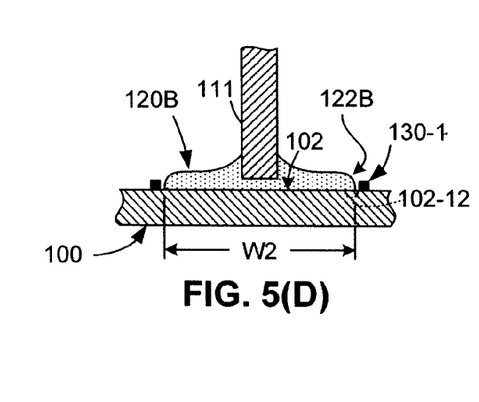
Figure 5E:
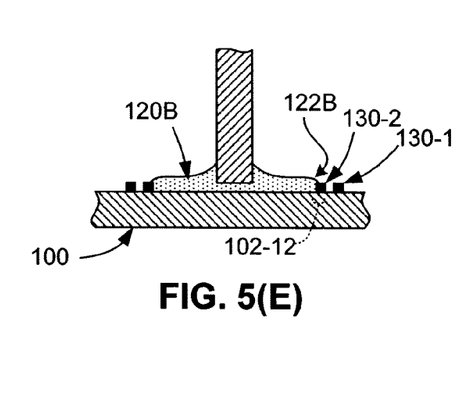
Figure 5F:
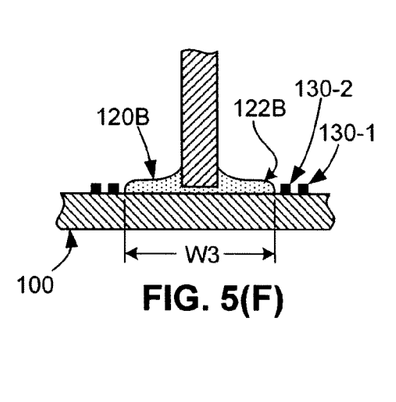

FIGS. 5(A) to 5(F) are partial edge views showing target substrate 100, control structure 110A, and a puddle 120E made up of a solution containing a relatively volatile solvent (implying a solvent that evaporates in a relatively short time at room temperature (e.g., water)), and illustrates a second process for forming parallel lines utilizing the "slip-stick" characteristic observed in conventional coffee-stain effect studies. It must be noted that the volatility of the solvent, as described by its time to vaporize under the ambient conditions must be of a larger time constant as compared to the time taken for the nanoparticles to reach the boundary. FIG. 5(A) shows substrate 100, control substrate 110A and solution 120B before lower edge 111A of control substrate 110A is inserted into upper surface 121B of puddle 120B, and indicates that peripheral boundary 122B has an arbitrary width W0. As indicated in 5(B), lower edge 111A of control substrate 110A is then inserted through upper surface 122B until lower edge 111A is a first distance Z1 from upper surface 102 of target substrate 100. As described above, the attraction of solution puddle 120B to control substrate 110A generates a capillary bridge that causes peripheral boundary 122B to shift inward such that the width of puddle 120 changes to width W1 and peripheral boundary 122B is aligned over linear region 102-11. In the manner described above, substrate 100 is maintained in the fixed position shown in FIG. 5(B) until sufficient solvent evaporates from peripheral edge 122B of puddle 120 to form a (first) self-organized line 130-1 on substrate 100 along first linear surface region 102-11, as indicated in FIG. 5(C). At this point, the inventors observed that by maintaining control substrate 110A in its Z-axis position (i.e., at distance Z1 relative to target substrate 100), the evaporation of the volatile solvent generates a "slip-stick" phenomenon by which peripheral boundary 122B incrementally shifts inward toward control substrate 110A by substantially regular distances. That is, as depicted in FIG. 5(C), under these conditions the inventors observed that peripheral boundary 122B becomes pinned ("sticks") to target substrate 100 over first linear region 102-11 as self-organized line 130-1 is formed, even though puddle 120B shrinks slightly. When the gravitational and fluid forces at peripheral boundary 122B overcome the attractive forces pinning peripheral boundary 122B to target substrate 100, peripheral boundary 122B becomes detached from first line 130-1 and "slips" (recedes) inward along upper surface 102, as indicated in FIG. 5(D). Note that the inward recession of peripheral boundary 122B stops when the fluid forces are again balanced, which in this case occurs when puddle 120B has a width W2 and peripheral boundary 122B is disposed over a second linear surface region 102-12, as illustrated in FIG. 5(D). Once peripheral boundary 122B is reformed at second linear surface region 102-12, it again "sticks" (becomes pinned), and a second self-organized line 130-2 is formed at linear surface region 102-12 (FIG. 5(E)) while the solution forming puddle 120B again evaporates and the inward forces on peripheral boundary 122B rebuild. As indicated in FIG. 5(F), when these forces are sufficiently strong, peripheral boundary 122B again slips inward and puddle 120B assumes a third width W3. This "slip-stick" phenomenon was observed to repeat itself multiple times as a solution puddle evaporated.

Figure 6:
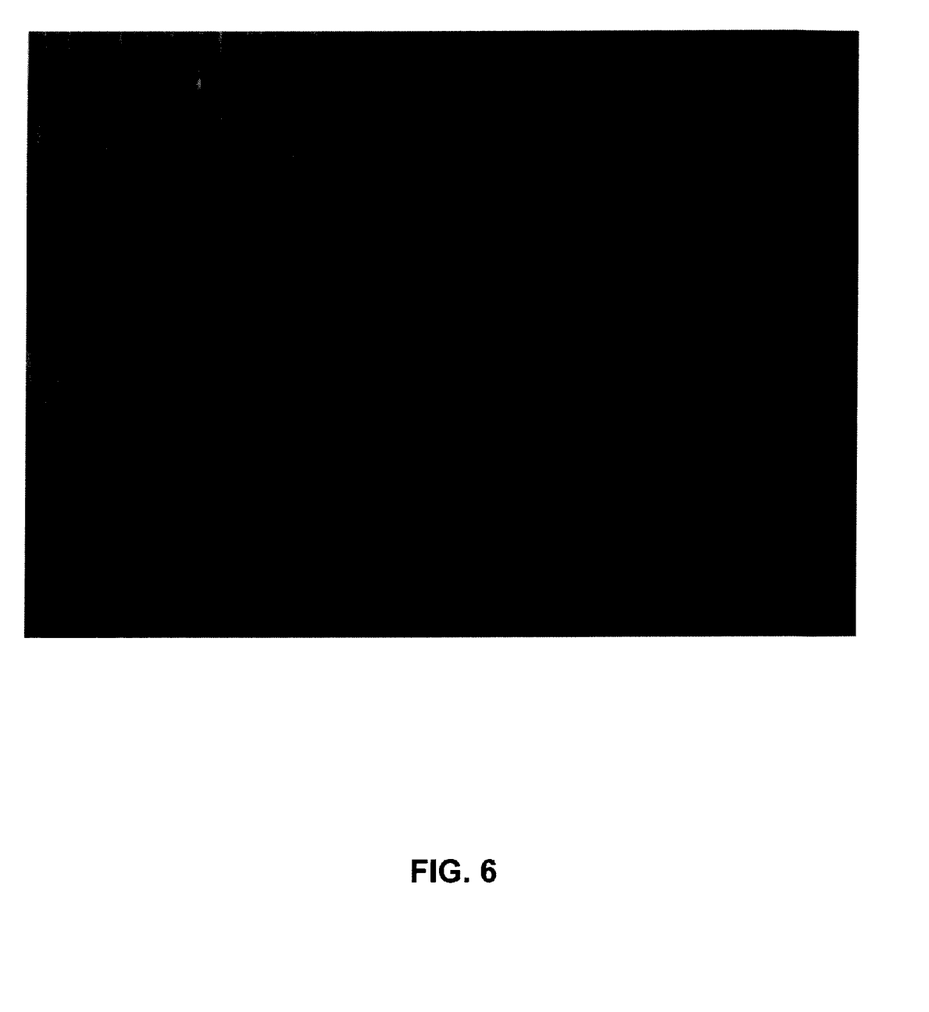
FIG. 6 is a photograph showing exemplary parallel lines formed by the inventors according to the modified coffee-stain method of the present invention.

FIG. 6 is an enlarged photograph showing lines formed in accordance with the methods described above. There are some defects, no doubt related to lack of cleanliness of the substrate or solution. The separation of the lines (each of which is about 1 micron) in is about 5 microns (which cannot be achieved using conventional printing techniques). Several important variables were observed that affect the printed pattern. First, the surface tension between the solution and the control substrate (which can be controlled by modifying the substrate surface by the deposition of different materials by evaporation or spin coating and the process temperature, which modifies the distance of separation between the patterned lines. Second, the surface tension between the solution and the target substrate is an important variable, and can also be controlled by modifying the target substrate surface and the process temperature (pinning is essential for line formation, depinning is essential for parallel line formation, thus the solvent must pin to the target substrate while the solute must not). The third important variable is temperature, which controls the rate of evaporation, and therefore the rate of solute deposition. The fourth important variable is vapor pressure, which also controls the rate of evaporation. The fifth important variable is the solute—its molecular packing density controls features of the coffee-stain line formation, and must not pin/stick to the target substrate surface with a force greater than the surface tension with the substrate.

According to another embodiment of the present invention, the parallel lines of conductive nanoparticles described above are used to develop solution-process thin-film transistors (TFTs) with short channel length and high transconductance for large-area electronic devices.

Figure 7A:
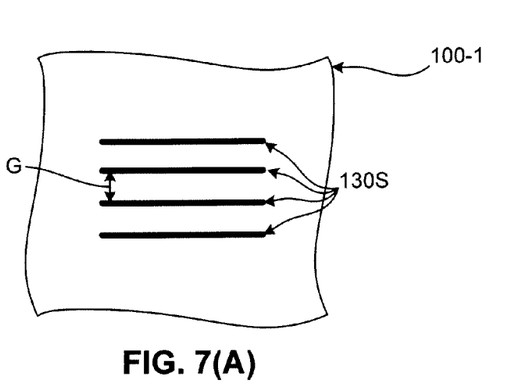
FIGS. 7(A), 7(B) and 7(C) are partial top plan views showing the formation of an interdigitated TFT according to a specific embodiment of the present invention.
Figure 7B:
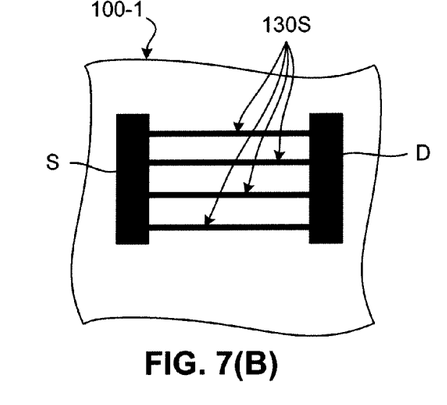
Figure 7C:
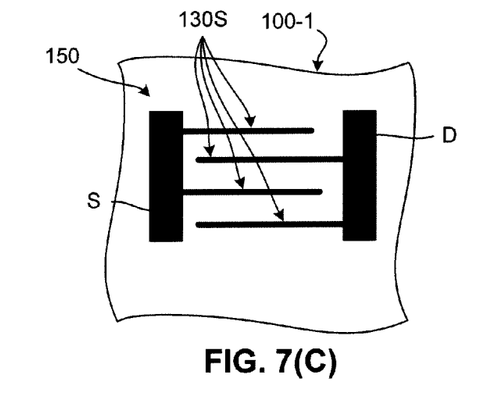

FIGS. 7(A) to 7(C) are simplified partial top views illustrating an exemplary method for utilizing the parallel lines formed on a substrate 100 to form interdigitated source and drain contacts for a TFT 150. First, the parallel lines formed using the methods described above are sintered (e.g., at 150° C. for ten minutes) so that the deposits of silver nanoparticles define parallel conductive lines. The lines are then isolated by cutting straight the lines into segments 130S using a laser or a comb of soft picks (FIG. 7(A)). As shown in FIG. 7(B), source and drain contacts (S and D) are then printed or deposited onto the ends of segments 130S using known techniques (e.g., jet printing), and then contact terminations (gaps) are cut between each segment 130S and one of contacts S and D as shown in FIG. 7(C) using, for example, a laser, to achieve high aspect ratio. The resulting interdigitated TFT 150, which has a high width to length ratio, is shown in FIG. 7(C).

Figure 8:
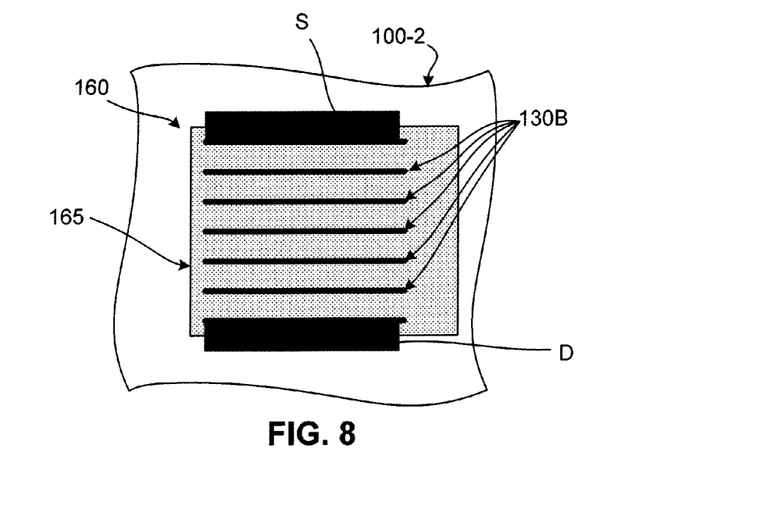
FIG. 8 is a partial top plan view showing a grid TFT formed in accordance with another specific embodiment of the present invention.

FIG. 8 is a simplified partial top view illustrating an exemplary grid TFT 160 formed in accordance with another specific embodiment of the present invention. Grid TFT 160 includes line segments 130B that are formed and patterned in the manner described above, with source and drain electrodes S and D printed/deposited parallel to segments 130B such that several segments 130B are disposed between electrodes S and D. This design uses segments 130B to reduce the effective channel length between source and drain electrodes S and D. Next, a gate dielectric [e.g., a polymer such as PVP, 165 is formed over segments 130B that contacts source and drain regions S and D. If the lines were formed on the oxide of a silicon wafer, the wafer can be used as the gate and the oxide as the dielectric. By utilizing several parallel segments 130B, it does not matter if there are some short-circuit events between adjacent segments 130B; hence, grid TFT 160 is robust against defects.

Figure 9:
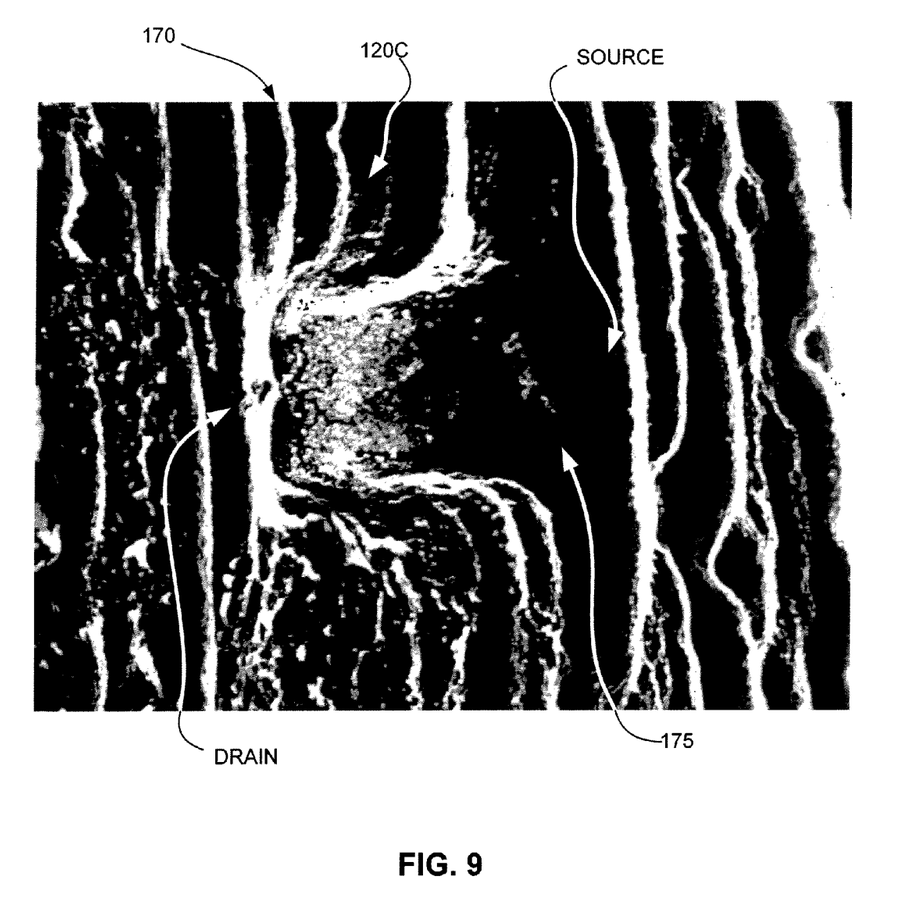
FIG. 9 is a photograph showing a transistor formed in accordance with another specific embodiment of the present invention.

The TFTs described above with reference to FIGS. 7C and 8 are intended to be exemplary of the uses for parallel lines formed in accordance with the modified coffee-stain method of the present invention in the production of large-area electronic devices. Those skilled it the art will recognize that the parallel lines may be utilized to form other useful fine features and structures (e.g., long conductive lines) on the large-area electronic devices. Modifications to the described method may be utilized to produce hybrid structures, modifying the shape of the lines through controlled depinning of the liquid meniscus, which can be induced by depositing hydrophobic regions on the substrate, for example using wax printing or stamping features on the substrate. Such defects inhibit or interfere with the line formation, and can be utilized to generate intended structures. For example, FIG. 9 is a photograph showing a transistor 170 formed by placing a foreign object (gate metal) 175 on the substrate prior to the formation of self-organized lines 130C. Transistor 170 has three electrodes—gate, source and drain. The inventors use the pattern formation for source/drain electrodes as described above, but inherently also assemble the gate by placing gate metal 175 in the path of the coffee stain formation, whereby lines 130C are made to bend around gate metal 175 as indicated in the photograph. Moreover, the methods described herein may be beneficially utilized in other systems and arts (e.g., paintings) as well. For example, parallel lines produced in accordance with the present invention may be used to form fine capillaries and fluidic channels, and templates for small feature stamps without the use of photolithography.

Figure 10:
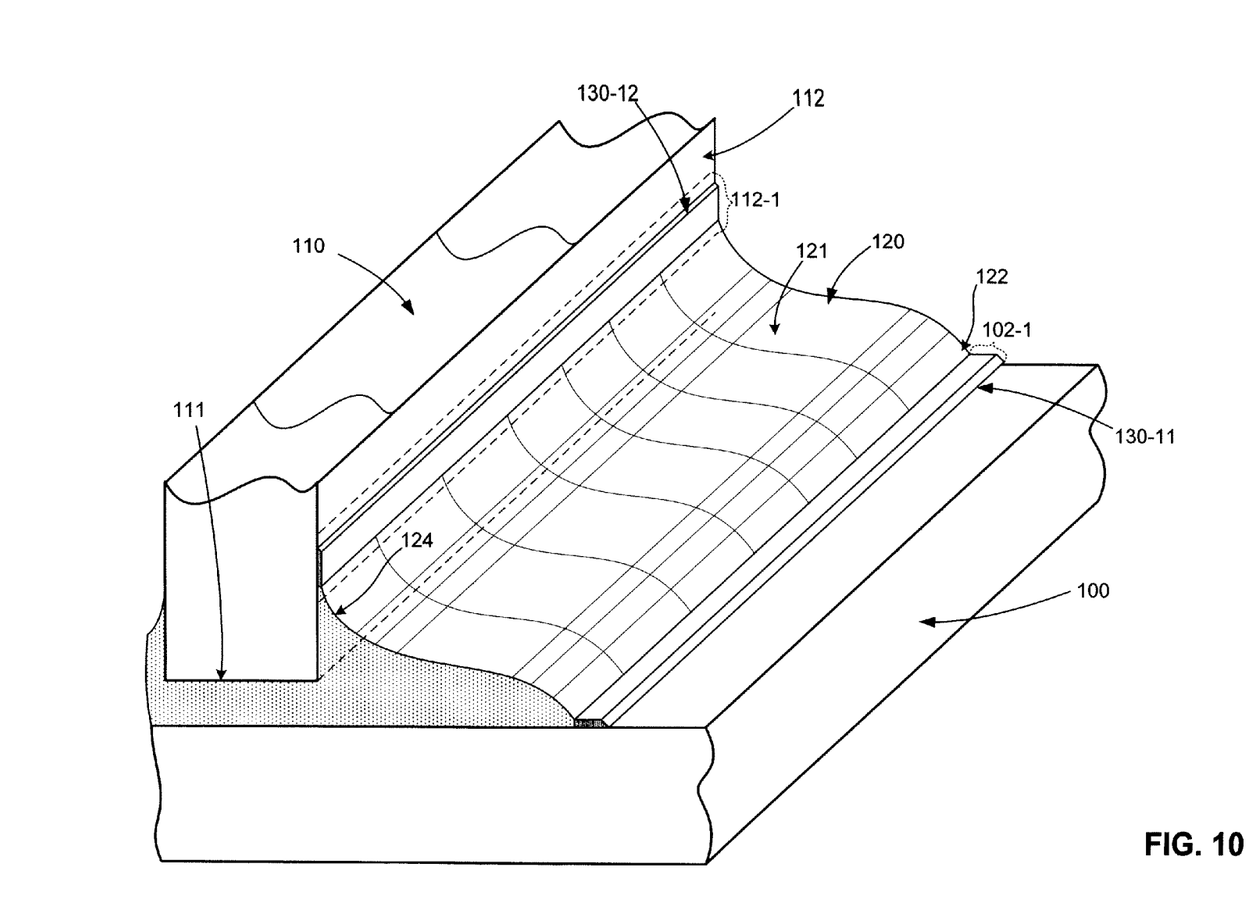
FIG. 10 is a top side partial perspective view depicting the simultaneous formation of self-organized lines on both the target substrate and the control structure according to another embodiment of the present invention.

FIG. 10 is a top side partial perspective view depicting the simultaneous formation of self-organized lines on both target substrate 100 and the control structure 110 according to another embodiment of the present invention. As described above with reference to FIG. 1, lower edge 111 of control structure 110 is submerged through upper surface 112 and disposed inside puddle 120 such that peripheral boundary 122 of puddle 120 is disposed over linear region 102-1 of target substrate 100, thereby facilitating the formation of self-organized lines structure 130-11. In addition, the attraction of the solvent forming puddle 120 to surface 112 of control structure 110 produces an upward curving waterline 124 to form at the liquid/air interface along a linear surface region 112-1 of control structure 110. The present inventors have discovered that under the proper temperature/pressure conditions, evaporation of solvent from upward-curving waterline 124 causes waterline 124 to recede downward along surface 112, thus causing residual solute to form a second self-organized line structure 130-2 above the receding waterline on linear surface region 112-1 of control structure 110. As such, the modified coffee-stain method of the present invention may be utilized to simultaneously form first self-organized lines structure 130-11 on target substrate 100 and second self-organized structure 130-12 on linear surface region 112-1 of control structure 110. This alternative embodiment may be utilized to simultaneously form self-organized line structures on the horizontal/vertical surfaces of a three-dimensional structure, not shown. Simultaneously forming lines structures on horizontal and vertical surfaces in this manner can facilitate lower manufacturing costs in some applications.

Figure 11:
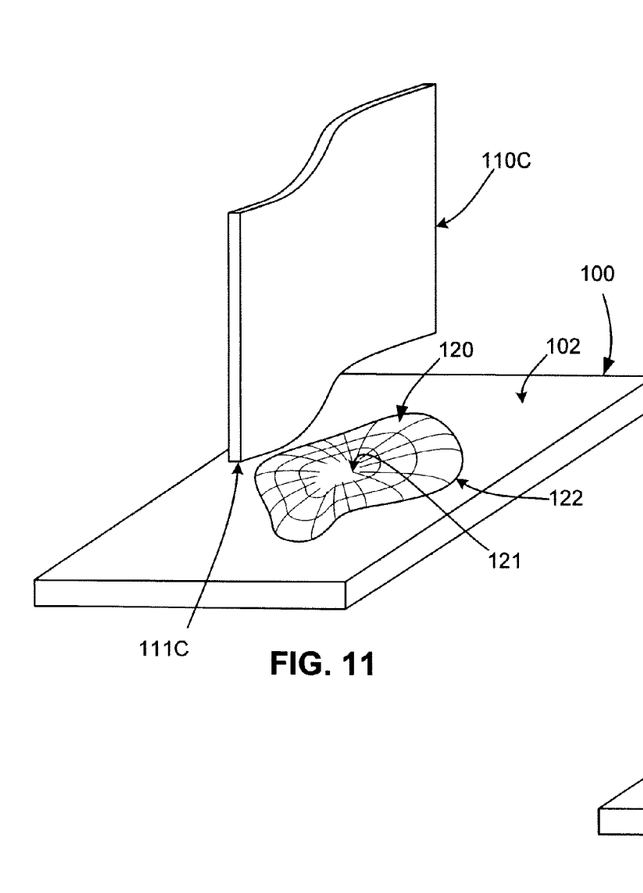
FIG. 11 is a top side partial perspective view showing an exemplary solution puddle arrangement for forming non-linear self-organized structures according to a specific embodiment of the present invention.
Figure 12:
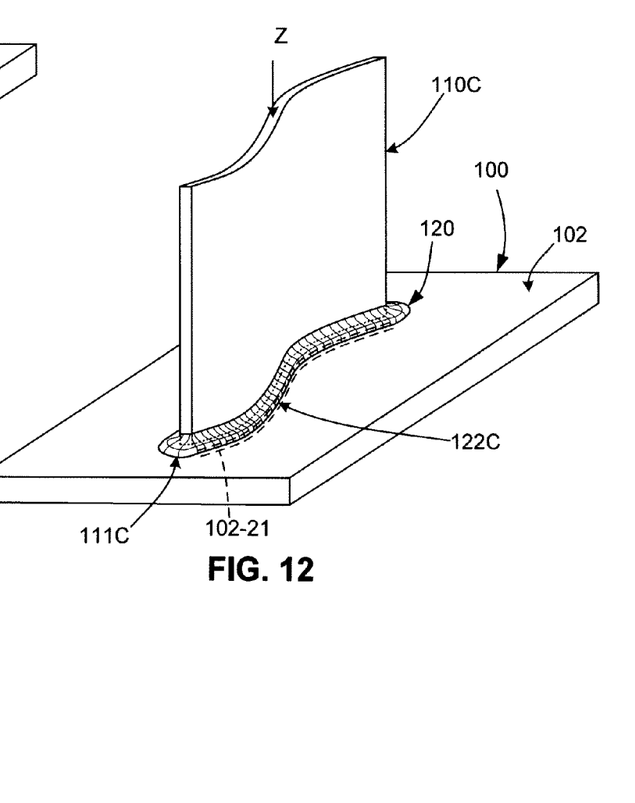
FIG. 12 is a top side partial perspective view showing the arrangement of FIG. 11 with the control structure in operable contact with the solution puddle.

According to another aspect of the invention mentioned above, the shape of parallel self-organized line structures formed on a target substrate using the modified coffee-stain method is controlled by a shape of the control structure contacting the solution puddle, and therefore is not limited solely to the straight-line structures described above. For example, FIGS. 11 and 12 show a control structure 110C that includes a curved (i.e., non-linear) edge 111C disposed over puddle 120 randomly formed on upper surface 102 of target substrate 100 in the manner descried above. As indicated in FIG. 12, when curved edge 111O is brought into contact with upper surface 121 of puddle 120, the randomly-shaped peripheral boundary 122 shown in FIG. 11 assumes a curved shape that is parallel to edge 111C of control structure 110C, and subsequently formed self-organized line structures are also parallel and similar to the curved shape of edge 110C. As such, the term "parallel lines" used herein is not intended to be limited to parallel straight lines, but also applies to curved lines that maintain a substantially constant spacing along their lengths. The present invention thus facilitates forming parallel lines having many shapes merely by changing the shape of the control structure utilized to contact the solution puddle.

Although the present invention has been described with respect to certain specific embodiments, it will be clear to those skilled in the art that the inventive features of the present invention are applicable to other embodiments as well, all of which are intended to fall within the scope of the present invention. For example, the lines produced by the modified coffee-stain method of the present invention are not limited to metal lines unless otherwise specified in the claims. Further, the modified coffee-stain method may be utilized to form structures other than large-area electronic devices, such as in the production of masks that are used for subsequent semiconductor processing steps (e.g., etch, implant, etc.).

The invention claimed is:

1. A method for forming a first self-organized structure on a target substrate, the method comprising:
   disposing a solution puddle on the target substrate and arranging a control structure adjacent to the target substrate such that a liquid/gas interface defined at an upper surface of the solution puddle is contacted by the control structure, wherein the solution puddle includes a solute disposed in a liquid solvent consisting of liquid molecules having a stronger attraction to the control structure than to themselves such that a peripheral boundary of the solution puddle conforms to a shape of the control structure, and wherein the solute consists of particles having an average size that is smaller than one micron; and
   causing the solvent to evaporate at a predetermined rate such that said peripheral boundary of the solution puddle recedes toward the control structure and a first residual portion of said solute forms said first self-organized structure along the receding peripheral boundary of said solution puddle.

2. The method according to claim 1, wherein the solution comprises silver nanoparticles disposed in de-ionized water.

3. The method according to claim 1, wherein the control structure comprises a control substrate having a straight edge, and wherein disposing the target structure in said solution comprises submerging said straight edge of the control substrate into an upper surface of the solution, whereby said peripheral boundary of the solution puddle conforms to said straight edge of the control substrate such that a portion of said peripheral boundary is aligned over a first linear surface region of said target substrate, and whereby said subsequently-formed first self-organized structure is a substantially straight and disposed over the first linear surface region.

4. The method according to claim 3, further comprising displacing said control substrate relative to the upper surface of said solution puddle after formation of said first self-organized structure such that said portion of said peripheral boundary of the solution puddle is displaced from being positioned over the first linear surface region to being positioned over a second linear surface region of said target substrate.

5. The method according to claim 4, further comprising causing the solvent to evaporate at the predetermined rate such that said peripheral boundary of the solution puddle recedes toward the control structure and a second residual portion of said solute forms a second self-organized structure along the receding peripheral boundary of said solution puddle over the second linear surface region.

6. The method according to claim 3, further comprising forming a second self-organized structure that is parallel to the first self-organized structure on a second linear surface region of said target substrate by allowing said peripheral boundary to slip from the first linear surface region to the second linear surface region, and then causing the solvent to evaporate at the predetermined rate such that the peripheral boundary recedes toward the control structure and a second residual portion of said solute forms a second self-organized structure along the receding peripheral boundary of said solution puddle over the second linear surface region.

7. The method according to claim 1, wherein causing the solvent to evaporate comprises altering one of a temperature and an air pressure surrounding said target structure and said solution.

8. The method according to claim 1, wherein arranging said control structure further comprises submerging an edge of said control structure into said upper surface of the solution puddle such that said upper surface forms an upward curving waterline on the first linear surface region of the control structure.

9. The method according to claim 8, wherein causing the solvent to evaporate further comprises causing the solvent located at the upward curving waterline to evaporate at the predetermined rate such that the upward curving waterline recedes downward along a linear surface region of the control structure, and such that a second residual portion of said solute forms a second self-organized structure above the receding waterline on the linear surface region of the control structure.

10. The method according to claim 1, wherein the control structure comprises a control substrate having a curved edge, and wherein disposing the target structure in said solution comprises submerging said curved edge of the control substrate into an upper surface of the solution, whereby said peripheral boundary of the solution puddle conforms to said curved edge of the control substrate such that a portion of said peripheral boundary is disposed over a curved surface region of said target substrate.

* * * * *